United States Patent [19]

Mehlkopf et al.

[11] Patent Number: 5,068,610

[45] Date of Patent: Nov. 26, 1991

[54] MRI METHOD AND DEVICE FOR FAST DETERMINATION OF THE TRANSVERSE RELAXATION TIME CONSTANT T2

[75] Inventors: Antoon F. Mehlkopf; Willem M. Prins, both of Eindhoven, Netherlands

[73] Assignee: U.S. Philips Corporation, New York, N.Y.

[21] Appl. No.: 358,327

[22] Filed: May 26, 1989

[30] Foreign Application Priority Data

Jul. 8, 1988 [NL] Netherlands ............... 8801731

[51] Int. Cl.$^5$ ............................................ G01R 33/54
[52] U.S. Cl. ................................................. 324/312
[58] Field of Search ................. 324/307, 309, 312

[56] References Cited

U.S. PATENT DOCUMENTS 4,720,679  1/1988  Patrick et al. ............... 324/309
4,866,386  9/1989  Sattin ............................ 324/312

FOREIGN PATENT DOCUMENTS 8502264  5/1985  PCT Int'l Appl.

OTHER PUBLICATIONS

H. Bruder et al, "A New Steady-State Imaging Sequence for Simultaneous Acquisition of Two MR Image with Clearly Different Contrasts", Magnetic Resonance in Medicine, vol. 7, (1988), pp. 35–42.

Primary Examiner—Jerry W. Myracle
Assistant Examiner—Kevin D. O'Shea
Attorney, Agent, or Firm—Jack D. Slobod

[57] ABSTRACT

An MRI method and device for fast determination of the transverse relaxation time constant T2 utilizes the fact that this time constant introduces asymmetry into all magnetic resonance echo signals (::exp(−t/T2) enabling determination of the time constant T2 from the asymmetry of the echo signals. During the determination of a spin density distribution the value of the time constant T2 can be determined for each pixel. After Fourier transformation of the resonance signal, integration of the imaginary terms is performed (in the coordinate direction of the measuring gradient). The quotient of the current integral and the real term of the associated pixel is an accurate measure of the time constant T2 in the relevant pixel.

21 Claims, 2 Drawing Sheets

MRI METHOD AND DEVICE FOR FAST DETERMINATION OF THE TRANSVERSE RELAXATION TIME CONSTANT T2

BACKGROUND OF THE INVENTION

1. Field of the Invention

The invention relates to a method of obtaining images of a nuclear magnetization distribution in a part of a body, in which nuclear spins are excited in the body in the presence of a steady magnetic field in order to generate a spin resonance signal, after which the spin resonance signal is sampled in the presence of a magnetic field gradient which is superposed on the steady magnetic field, after which the resonance signals thus sampled are converted into an image of said distribution by signal transformation. The sampled resonance signals may be pulse echo signals or field echo signals according to the described method. The invention also relates to an MRI device comprising a magnet system for generating a steady, uniform magnetic field and for generating magnetic field gradients, and also comprising an RF transmitter and receiver for generating and detecting spin resonance signals, a sampling device for sampling the resonance signals generated, a signal transformation device for transforming the sampled spin resonance signals, a display device for displaying transformed signals, and a control device for controlling the magnet system, the RF transmitter and receiver, the sampling device, the signal transformation device and the display device.

2. Prior Art

Such a method and device are known from U.S. Pat. No. 4,070,611 and are often used for obtaining in vivo images on the basis of the density and other properties of the nuclear magnetization distribution in the object examined. Furthermore, PCT Application WO 85/02264, which corresponds to U.S. Pat. Nos. 4,573,014 and 4,634,979, describes a method of synthesizing such images of an object or a part of an object. Therein, it is assumed that the signal intensity in a point of an image is determined by the local magnetization MO, the local longitudinal and transverse relaxation time constants T1 and T2, and the parameters used in the measuring method, for example the repetition time of the measuring cycles TR and the waiting time TE elapsing between the excitation at the beginning of the measuring cycle and the instant of sampling of the spin resonance signal. By determining a number of images where the measuring parameter TR as well as the measuring parameter TE is varied, the magnetization MO and the longitudinal and transverse relaxation time constants T1 and T2 can be calculated for each pixel. Once this data is known, for arbitrary TR and TE synthetic images can be reconstructed as if these images had been obtained during a measurement characterized by these measuring parameters TR and TE. Thus, images can be synthesized in which the contrast between the various parts of the image can be optimized. The described method thus always requires a number of complete images before synthetic images can be reconstructed. This has direct consequences for the measuring time required, i.e. for the time during which an object must remain in the MRI device.

SUMMARY OF THE INVENTION

It is the object of the invention to provide an MRI method and device whereby different spin resonance parameters of pixels in an object can be quickly determined, i.e. the spin density (or equilibrium magnetization MO) and the transverse relaxation time constant T2, only one echo matrix being required for a spin density distribution, i.e. only one image frequency matrix need be acquired.

To achieve this, a method in accordance with the invention is characterized in that the nuclear magnetization distribution is a transverse relaxation time constant distribution, from the relative asymmetry of spin echo signals whose asymmetry is caused by the transverse relaxation of the spins generating the spin echo signals there being derived a measure of the local transverse relaxation time constant.

The method in accordance with the invention utilizes the fact that the transverse relaxation influences the spin echo signal as a function of time. This influence is an exponential function ($\exp -t/T2$), in which T2 is the transverse relaxation time constant. It is to be noted that the time constant T2(x, y, z) is location-dependent and may differ from one pixel to another of an image to be reconstructed.

A version of a method in accordance with the invention for determining the spin density distribution and the distribution of the transverse relaxation time constant T2 in a part of a body, in which nuclear spins are excited in the body in the presence of a steady magnetic field in order to generate a spin resonance signal, after which the spin resonance signal is sampled in the presence of a magnetic field gradient which is superposed on the steady magnetic field and which has a first direction, after which said distributions are determined by signal transformation from the resonance signals thus sampled, is characterized in that, after Fourier transformation of signal samples of the spin resonance signals, the imaginary part of the transformed signals is integrated, after which the quotient of the real part and the integrated imaginary part of the transformed signals is determined. Preferably, it is ensured that the signal is acquired with such a phase that the Fourier transform of the signal samples would have become purely real in the absence of transverse relaxation, i.e. for an infinitely large transverse relaxation time constant T2.

According to another feasible method, the phase of the spin resonance signal is corrected so that, after Fourier transformation, the signal satisfies the condition that it would have become purely real after Fourier transformation in the absence of transverse relaxation, after which, subsequent to Fourier transformation of these phase-corrected signal samples, the imaginary part of the transformed signals is integrated, after which the quotient is determined of the real part and the integrated imaginary part of the transformed signal.

As a supplement to a feasible method, for those pixels whose integrated imaginary part of the transformed signals is too small for determining said quotient, said determination of the quotient is replaced by another operation, such as an estimation on the basis of surrounding pixels, or equating the result to zero.

In another feasible method, the integration of signals after Fourier transformation is replaced by an operation which is equivalent to Fourier transformation, from a signal-processing point of view, i.e. filtering with a filter function which is equal to or derived from the weighting function (1/t).

The invention utilizes the fact that a spin resonance signal is influenced by the transverse relaxation time constant T2. First of all, the absolute signal value is proportional to $\exp(-TE/T2)$. Secondly, because of this transverse relaxation time constant T2 the sampled spin resonance signal has a given asymmetry. From this asymmetry enough information can be extracted to determine an image of the spin density $\rho(x, y, z)$ as well as an image of the time constant $T2(x, y, z)$ from the same MRI measurement.

After Fourier transformation of a spin resonance signal obtained during a sampling period, a frequency distribution is found with a real and an imaginary component. Provided that the spin resonance signal is acquired with the correct phase, the real part of this frequency distribution is given by the expression $\rho(x, y, z)*\exp(-TE/T2(x, y, z))$. Normally, the imaginary part is ignored or, when modulus images are calculated, the effect of this term is ignored for the interpretation thereof. However, this is fully correct only if no effect were exerted by the transverse relaxation time constant T2.

This is because the imaginary part of such a transformed signal is given by the expression $$-d/dx\{C*\rho(x,y,z)*1/T2(x,y,z)*\exp(-TE/T2(x,y,z))\}$$

i.e. as the derivative to x, being the coordinate corresponding to the direction of the read gradient, of the product of a constant c which depends on the strength of the read gradient, and the gyromagnetic ratio of the detected nucleus, the spin density $\rho(x, y, z)$, the weighting factor $\exp(-TE/T\,2\,(x, y, z))$, and the inverse of the transverse relaxation time $T2(x, y, z)$. When this imaginary part is integrated as a function of the coordinate x, producing the signal $\rho(x, y, z)*1/T2(x, y, z)*\exp(-TE/T2(x, y, z))$ and subsequently the real part of the result of the Fourier transformation is divided thereby, this quotient will be a very accurate measure of the transverse relaxation time constant $T2(x, y, z)$. Once this constant is known, a very accurate spin density $\rho(x, y, z)$ can be determined therefrom, together with the real part of the Fourier transformed spin resonance signal.

A feasible version of the method in accordance with the invention is characterized in that, after Fourier transformation of signal samples of the spin resonance signals, the imaginary part of the transformed signals is integrated, after which the quotient is determined of the real part and the integrated imaginary part of the transformed signals, it also being ensured that the spin resonance signal is acquired with a phase such that the Fourier transform of said signal would have become purely real in the absence of transverse relaxation, i.e. for an infinitely long T2.

Another feasible version of the method in accordance with the invention is characterized in that the correction of the phase of the spin resonance signal is continued until the Fourier transformed signal satisfies the requirement that after Fourier transformation it would have become purely real in the absence of transverse relaxation, Fourier transformation of said phase-corrected signal samples being followed by integration of the imaginary part of the transformed signals after which, unless the integrated imaginary part of the transformed signals is too small for this purpose, the quotient of the real and the integrated imaginary part of the transformed signal is determined. For pixels where the integrated imaginary part of the transformed signals is too small, the determination of the quotient is replaced by another operation, such as estimation on the basis of surrounding pixels, or equation of the result to zero.

Another feasible version of the method in accordance with the invention is characterized in that the integration of signals after Fourier transformation is replaced by an operation which is equivalent to Fourier transformation from a signal processing point of view, i.e. filtering with a filter function which is equal to or derived from the weighting function.

A preferred version of the method in accordance with the invention is characterized in that a spin resonance signal is sampled in the presence of a magnetic field whose gradient has a first direction, it being ensured that the spin resonance signal is sampled or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction, for each pixel the real component of said Fourier transform associated with the relevant pixel being divided by this current integral.

Using the distribution of the transverse relaxation time constant T2 determined by means of this method, the image associated with the real part of said Fourier transform can be corrected so that, for the same resolution, a pure spin density distribution $\rho$ is found for the same part of the body as that for which the distribution of the transverse relaxation time constant T2 has been determined.

An MRI device in accordance with the invention is characterized in that the signal transformation device comprises arithmetic means for integrating the imaginary parts of the signal transform of the sampled spin resonance signals and for determining the quotient of the real parts of the signal transform and said integrated imaginary parts.

In the device in accordance with the invention, the spin density distribution as well as the distribution of the transverse relaxation time constant can be determined from a single measurement, i.e. from a single acquired image frequency matrix, by adding only a minimum amount of software and/or hardware.

A preferred embodiment of an MRI device in accordance with the invention in which the signal transformation device performs a Fourier transformation and comprises storage means for storing the real and the imaginary parts of the Fourier transform of the spin resonance signals is characterized in that there are provided further storage means for storing the current integral values of the imaginary parts and/or for storing the quotient of the real parts of the Fourier transform and the associated values of this current integral. This preferred embodiment of the MRI device in accordance with the invention requires only additional storage means corresponding to one image and per pixel in principle only two additional calculations for determining the distribution of the transverse relaxation time constant T2.

BRIEF DESCRIPTION OF THE DRAWING

The invention will be described in detail hereinafter with reference to a number of embodiments which are shown in a drawing; therein

DETAILED DESCRIPTION OF THE PREFERRED EMBODIMENTS

Figure 1:
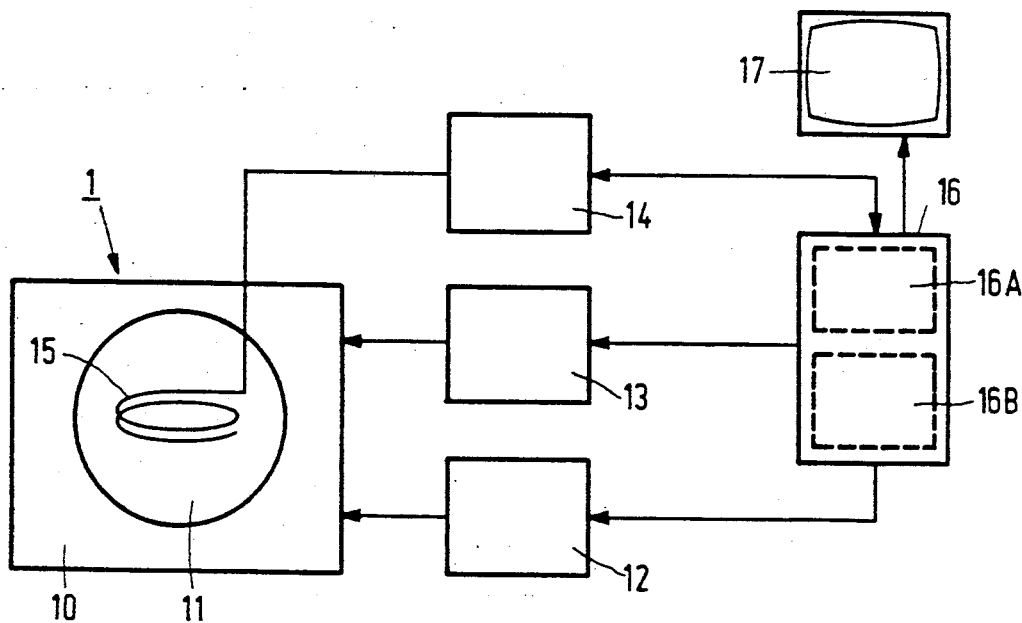
FIG. 1 shows a device in accordance with the invention.

The MRI device 1 shown in FIG. 1 comprises a magnet system 10 for generating the steady, uniform magnetic field and the magnetic field gradient. Said magnetic fields are generated in an examination space 11 in which the object to be examined is situated, for example a patient. The magnet system 10 is driven by generators 12 and 13, the generator 12 generating the steady magnetic field whilst the generator 13 generates a magnetic field gradient which may have an arbitrary direction. For generating a uniform, steady magnetic field, the magnet system 10 comprises a resistance coil or a superconducting coil which is driven by the generator 12.

The MRI device 1 also comprises a transmitter/receiver 14 which drives a transmitter/receiver coil 15. After activation of the transmitter coil 15, spin resonance signals are generated in the object situated in the examination space 11, which signals are detected by means of the receiver coil 15 and are applied to the receiver in the transmitter/receiver 14. Depending on the measuring technique to be executed, the same coil can be used for the transmitter coil and the receiver coil or use can be made of separate coils for transmission and reception. The detected resonance signals are sampled, digitized and applied to a central unit 16. The generating, detection and digitizing of the spin resonance signals by the receiver 14 will be described in detail hereinafter. The unit 16 comprises a signal transformation device 16a and a control and regulating unit 16b which controls the generators 12 and 13 as well as the transmitter/receiver 14 and also synchronizes their operation. The signal transformation device 16a processes the resonance signals measured so as to obtain an image of the excited part of the object. There is also provided a display device 17, for example a monitor, for the display of the reconstructed image.

Figure 2:
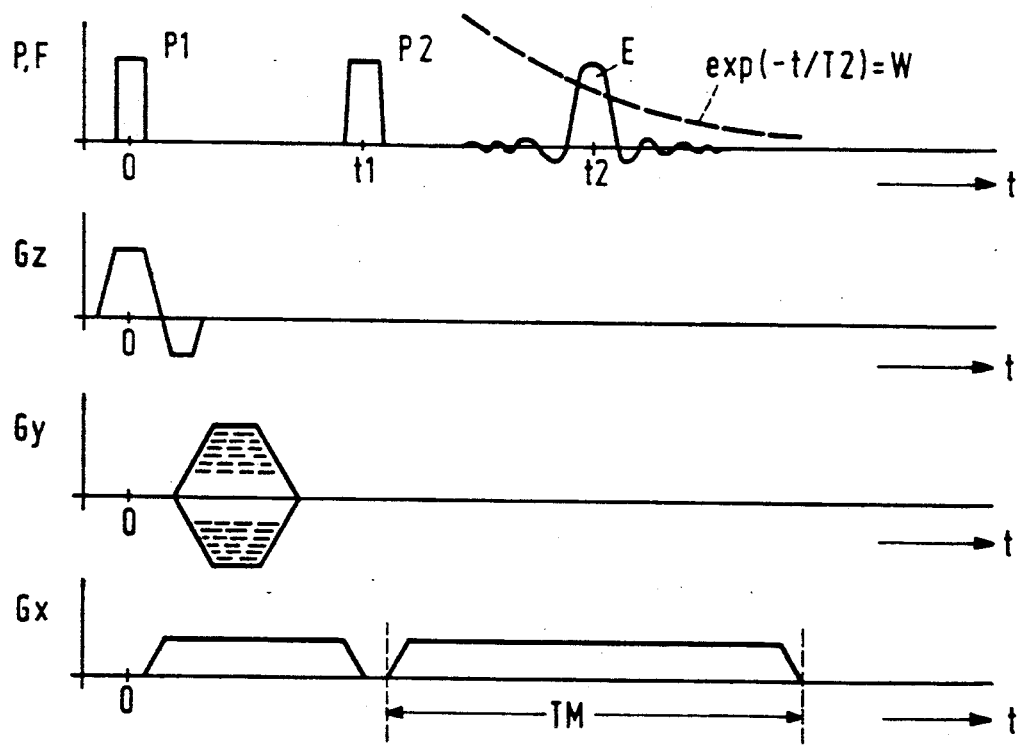
FIG. 2 shows a version of a measuring cycle in accordance with the invention.

FIG. 2 illustrates a known measuring method, which is referred to as a spin echo method. This spin echo method may form part of the method in accordance with the invention, as will be described hereinafter. Prior to the instant t=0, the control means 16b will activate the generator 13 in order to generate a magnetic field gradient Gz so that, when the control means 16b activate the transmitter 14 at the instant t=0 in order to generate an RF pulse P1 which is usually a 90° pulse, the spins are excited in an arbitrarily oriented selected slice of an object arranged in the examination space 11. After termination of the RF pulse P1 and before a next RF pulse P2, a second magnetic field, having a gradient Gy, is applied, and also a third magnetic field, having a gradient Gx, the time integral of the magnetic field gradient Gy being different for each measuring cycle. As is known, the time integral of the magnetic field having the gradient Gy is used to select an image frequency ky and for each value of ky the spin resonance signal is measured as a function of the image frequency kx, where kx is determined by the time integral of the magnetic field having the gradient Gx. At the instant t1, the RF pulse P2, being a so-called echo pulse, is generated, which pulse is usually a 180° pulse, so that an echo signal E is generated approximately at the instant t2, the period of time expiring between the instants t=0 and t1 and the period of time expiring between the instants t1 and t2 being equal, which echo signal is sampled in the presence of a magnetic field gradient Gx. The amplitude of this signal E is a function of the spin density $\rho$ and the relaxation time constants T1 and t2.

It will be apparent that, after the sampling period Tm during which the signal samples of the echo signal E are taken, a new echo signal can be generated by means of a next 180° pulse, followed by sampling. When, moreover, the magnetic field gradient Gy is temporarily activated in advance as described above, the advantage is achieved of reduced the period of time required for taking a sufficient number of signal samples. This method is also well known. Actually, the described invention can be used for all measuring methods where pulse echoes or field echoes are generated. The echo signal generated by means of such a measuring method is weighted as a function of time with the function $\exp(-t/T2)$. FIG. 2 shows this weighting factor as a function W.

Figure 3:
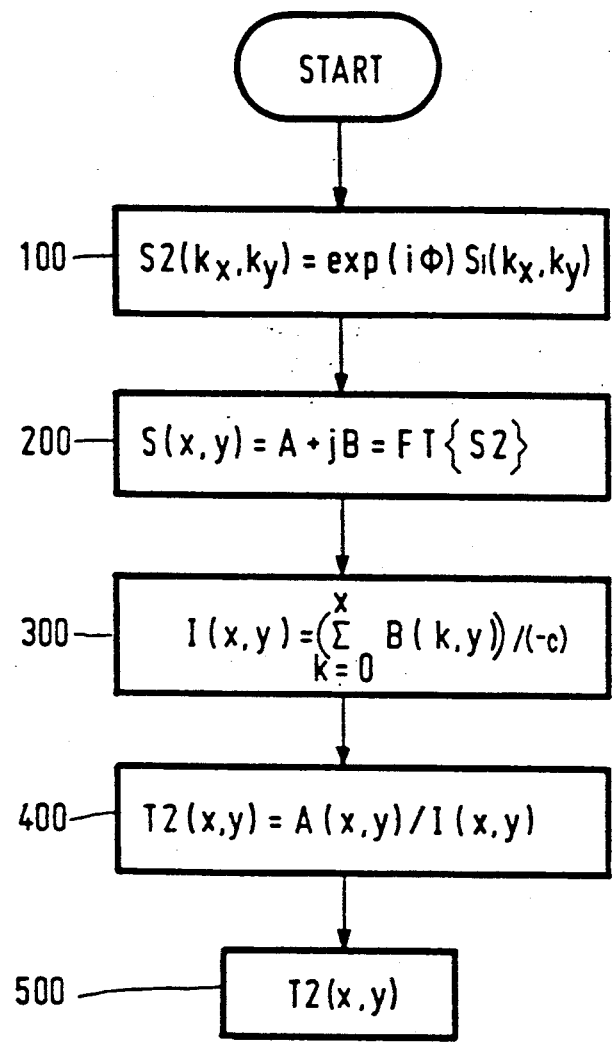
FIG. 3 shows a flowchart illustrating an example of the processing of the signals of the measuring cycle shown in FIG. 2.

The flowchart of FIG. 3 illustrates the processing of the signal samples obtained by means of the measuring method shown in FIG. 2. These signal samples are obtained as a function of the image frequencies kx and ky which are determined by the time integral of the intensity of the respective magnetic field gradients Gx and Gy, said integral extending from the excitation pulse until the instant at which a signal sample is taken.

In accordance with a first step 100 of the flowchart, the phase of the signal samples S1(kx, ky) is corrected, if necessary, as is expressed by the expression $\exp(i0)$ and which is well known.

As is indicated in the second step 200 of the flowchart, a distribution S(x, y) is determined by Fourier transformation from the image frequency matrix S2(kx, ky) thus obtained. If the transverse relaxation time constant T2 had not had an effect, the spin density $\rho(x, y)$ would thus have been found, because S1(kx, ky) and $\rho(x, y)$ would then have formed a a Fourier pair. In reality, the time constant T2 always has an effect and the acquired image frequency matrix S(kx, ky) is the product of a Fourier transform of $\rho(x, y)$ and the weighting function $W = \exp(-t/T2(x, y))$.

The weighting function W can be rewritten as $\exp(-(\tau + TE)/T2)$. Therein, TE is the time elapsing between the pulse P1 at the instant t=0 and the center (=t2) of the echo signal E, as shown in FIG. 2. The time $\tau$ is taken from the instant t=TE, so that it can assume positive as well as negative values. The weighting function W thus described can be decomposed, as a function of $\tau$, into a symmetrical part SD and an asymmetrical part AD: $W = SD + AD$, where $SD = \exp(-TE/T2) * \cos(\tau/T2)$ and $AD = \exp(-TE/T2) * \sin(\tau/T2)$. These expressions for the symmetrical part SD and the asymmetrical part AD of the weighting function can be simplified, because the signal weighted thereby quickly becomes 0 outside $\tau = 0$, so as to obtain $SD = \exp(-TE/T2)$ and $AD = (-\tau/T2) * \exp(-TE/T2)$.

For a given distribution of $\rho$, the real part A of the signal S(x, y) obtained in the step 200 is determined only by the symmetrical part SD of the weighting function W; this real part A is equal to $\rho * \exp(-TE/T2)$. The imaginary part B of the signal S(x, y) is determined only by the asymmetrical part AD of the weighting function W for a given distribution of $\rho$. From the expression last given for AD it can be derived that this imaginary part B is equal to $-d/dx\{C^*\rho/T2^*\exp(-TE/T2)\}$, where C is a constant which depends on the strength of the read gradient and on the gyromagnetic ratio of the detected nucleus, x being the coordinate corresponding to the direction of the read gradient.

According to a third step 300 of the flowchart, the imaginary part B of the signal S(x, y) is integrated over the coordinate x and divided by the factor $-C$. The current integral values of the signal B form a new signal I(x, y) which is described by the expression $\rho/T2^*\exp(-TE/T2)$.

As is shown in a fourth step 400 of the flowchart, per pixel the quotient of the signal A(x, y) and the integrated signal I(x, y) is determined. This is done for all pixels. It follows from the expressions given for these signals that this quotient is equal to the transverse relaxation time constant T2. The fact that the expression used for I(x, y) is not exact leads to small differences between this quotient and the actual value of T2.

An image of the time constant T2 thus obtained can be displayed on the display device 17 (see FIG. 1) during a next step 500.

We claim:

1. A method of obtaining images of a nuclear magnetization distribution in a part of a body, in which nuclear spins are excited in the body by rf excitation pulses in respective measurement cycles in the presence of a steady magnetic field in order to generate each cycle a spin resonance echo signal centered at an echo time TE after a said rf excitation pulse, after which in each cycle the spin resonance signal is sampled in the presence of a magnetic field gradient which is superimposed on the steady magnetic field, after which measurement cycles the resonance signals thus sampled are converted into an image of said distribution by signal transformation, characterized in that the distribution of the transverse relaxation time constant is determined from the relative asymmetry of only the sampled spin resonance echo signals centered about echo time TE.

2. A method of determining the spin density distribution and the distribution of the transverse relaxation time constant T2 in a part of a body, in which nuclear spins are excited in the body in the presence of a steady magnetic field in order to generate a spin resonance signal, after which the spin resonance signal is sampled in the presence of a magnetic field gradient which is superposed on the steady magnetic field and which has a first direction, after which said distributions are determined by signal transformation from the resonance signals thus sampled, characterized in that, after Fourier transformation of signal samples of the spin resonance signals, the imaginary part of the transformed signals in said first direction is integrated, after which the quotient of the real part and the integrated imaginary part of the transformed signals is determined.

3. A method as claimed in claim 2, characterized in that the signal is acquired with a phase such that, after Fourier transformation, said signal would have become purely real in the absence of transverse relaxation.

4. A method as claimed in claim 2, characterized in that for those pixels whose integrated imaginary part of the transformed signals is too small for determining said quotient, said determination of the quotient is replaced by another operation, such as an interpolation from surrounding pixels.

5. A method as claimed in claim 2, characterized in that the integration of signals after the Fourier transformation is approximated by filtering with a filter function which is equal to or derived from the weighting function (1/t).

6. A method as claimed in claim 2, characterized in that the phase of the spin resonance signal is corrected prior to or after the Fourier transformation so that the Fourier transform of said signal would have become purely real in the absence of transverse relaxation.

7. A method as claimed in claim 2, characterized in that the quotient determined for each pixel is used as an estimate of the transverse relaxation time constant T2.

8. A method as claimed in claim 1, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

9. An MRI device, comprising a magnet system for generating a steady, uniform magnetic field and for generating magnetic field gradients, and also comprising an RF transmitter and receiver for generating and detecting spin resonance signals, a sampling device for sampling the resonance signals generated, a signal transformation device for transforming the sampled spin resonance signals, a display device for displaying the transformed signals, and a control device for controlling the magnet system, the RF transmitter and receiver, the sampling device, the signal transformation device and the display device, characterized in that the signal transformation device comprises arithmetic means for integrating the imaginary parts of the signal transform of the sampled spin resonance signals and for determining the quotient of the real parts of the signal transform and said integrated parts.

10. An MRI device as claimed in claim 9 in which the signal transformation device performs a Fourier transformation and comprises storage means for storing the real and imaginary parts of the Fourier transform of the spin resonance signals, characterized in that there are provided further storage means for storing values equal to or derived from the integral values of the imaginary parts.

11. A method as claimed in claim 3, characterized in that the quotient determined for each pixel is used as an estimate of the transverse relaxation time constant T2.

12. A method as claimed in claim 4, characterized in that the quotient determined for each pixel is used as an estimate of the transverse relaxation time constant T2.

13. A method as claimed in claim 5, characterized in that the quotient determined for each pixel is used as an estimate of the transverse relaxation time constant T2.

14. A method as claimed in claim 6, characterized in that the quotient determined for each pixel is used as an estimate of the transverse relaxation time constant T2.

15. A method as claimed in claim 2, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

16. A method as claimed in claim 3, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

17. A method as claimed in claim 4, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

18. A method as claimed in claim 5, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

19. A method as claimed in claim 6, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

20. A method as claimed in claim 7, characterized in that a spin resonance signal is sampled in the presence of a magnetic field whose gradient has a first direction, it being ensured that the spin resonance signal is acquired or corrected so that, after Fourier transformation, it would produce a purely real result in the absence of transverse relaxation, for the determination of the distribution of the transverse relaxation time constant T2 the imaginary components of the Fourier transform of the signals thus obtained being integrated in said direction to form an integral associated with each pixel, the real component of said Fourier transform associated with each pixel being divided by said integral associated with said pixel.

21. A method as claimed in claim 1 wherein said method is for obtaining a nuclear magnetization density distribution and wherein the determined transverse relaxation time constant distribution is used to correct the nuclear magnetization density distribution.

* * * * *